United States Patent [19]
Klein

[11] Patent Number: 5,907,175
[45] Date of Patent: May 25, 1999

[54] FOUR TRANSISTOR SRAM CELL

[75] Inventor: Richard K. Klein, Mountain View, Calif.

[73] Assignee: Advanced Micro Devices, Inc, Sunnyvale, Calif.

[21] Appl. No.: 08/937,676

[22] Filed: Sep. 25, 1997

[51] Int. Cl.$^6$ .......................... H01L 29/76; H01L 27/01; H01L 29/00

[52] U.S. Cl. .......................... 257/379; 257/350; 257/536; 257/537

[58] Field of Search ...................................... 257/379, 350, 257/751, 904, 903, 536–538; 438/210, 238, 382, 384

[56] References Cited

U.S. PATENT DOCUMENTS

| | | | |
|---|---|---|---|
| 4,924,295 | 5/1990 | Kiiecher | 257/751 |
| 5,182,225 | 1/1993 | Matthews | 257/276 |
| 5,530,418 | 6/1996 | Hsu et al. | 438/384 |

*Primary Examiner*—Minh Loan Tran
*Assistant Examiner*—Hung K. Vu
*Attorney, Agent, or Firm*—Foley & Lardner

[57] ABSTRACT

A device structure comprising a resistor in a via opening between adjacent levels of metallization of a conventional field effect transistor (FET) by disposing amorphous (α) silicon between metal barrier layers, such as titanium tungsten and titanium nitride, at the via opening which is filled with a conductive material, such as tungsten, the device structure enabling a conventional FET and the resistor to only take the space of a conventional FET due to the unique properties of α-silicon.

11 Claims, 5 Drawing Sheets

FOUR TRANSISTOR SRAM CELL

FIELD OF THE INVENTION

The present invention relates to fabricating integrated circuits and, more specifically, to a static random access memory (SRAM) integrated circuit with a reduced cell size and the fabrication method.

BACKGROUND OF THE INVENTION

With the demand for higher levels of integration of semiconductor chips, such as silicon semiconductor chips, there is a need for greater density and a demand to reduce the amount of silicon used for each of the circuits. This is especially the case with a SRAM, either on a microprocessor integrated circuit chip, of which a large portion of the silicon is a SRAM, or as a separate chip. For increased performance of future microprocessor, the storage capacity of the SRAM must increase thereby requiring a larger portion of the silicon of the microprocessor as the SRAM or a larger separate SRAM chip.

A 1-bit storage cell in a SRAM consists of a simple latch circuit with two stable operating points or nodes. Depending on the preserved state of a two-invertor latch circuit, the bit of data being held in the cell will be interpreted either as a logic "0" or as a logic "1". To access the data in the cell via a bit line, a switch is controlled by a corresponding word line carrying a row address selection signal. Two complementary access switches are used to connect the 1-bit SRAM cell to the complementary bit lines. A field effect transistor (FET) SRAM cell consists of two cross-coupled invertors and two access transistors. The load devices may be polysilicon resistors, depletion-type N-type FETs, or P-type FETs depending on the type of SRAM cell. Pass gates acting as data access switches are enhancement-type N-type FETs. Of these load devices, the use of resistive-load invertors with polysilicon resistors in the latch structure results in a significantly more compact cell size, compared with the other alternative described, because it reduces the cell size to four transistors in contrast to six transistors of the other alternative. However, creating a polysilicon load resistor is quite difficult and expensive from manufacturing standpoint in that, not only is a critical mask required for the polysilicon load resistor, but another critical mask is required for the contact to the load resistor, conventionally called a quasi-buried contact (QBC). In addition, care must be taken to isolate the polysilicon load resistor. Although a load resistor takes less layout space than a FET, the resistor still takes up a significant amount of space. Further, special implants and other special processing is usually required in fabricating the polysilicon load resistor.

SUMMARY OF THE INVENTION

Accordingly, it is an object of the present invention to provide an integrated circuit fabrication method which reduces layout area of a SRAM with resistive loads.

Another object of present invention is to provide an integrated circuit fabrication method in which critical masks and special implants are not required in manufacturing a SRAM with resistive loads.

A further object of present invention is to provide an integrated circuit fabrication method which reduces the level of manufacturing difficulty and lowers the expense in the manufacture of SRAMs with resistive loads.

In accordance with the present invention, a load resistor of a SRAM is fabricated by using amorphous (α) silicon which is sandwiched between two metals which function as barrier metals and which is disposed adjacent a conductive via between a pair of conductive lines. The fabrication method comprises the steps of: forming a conventional FET with a level of metallization of a first conductive line; forming an interlevel insulating layer on the conductive line; forming a via opening in the insulation having a bottom adjacent the conductive line; forming a resistor comprising a conductive material in the via opening and an amorphous (α) silicon layer adjacent each other and a plurality of barrier metal layers, at least one being in contact with α-silicon layer and at least one being in contact within the conductive material; and forming a level of metallization of a second conductive line, said α-silicon resistor being between the first and second conductive lines.

BRIEF DESCRIPTION OF THE DRAWINGS

The foregoing and other objects, aspects and advantages will be better understood from the following detailed description of preferred embodiments of the invention with reference in the drawings, in which.

DETAILED DESCRIPTION OF THE PREFERRED EMBODIMENTS OF THE INVENTION

Figure 1:
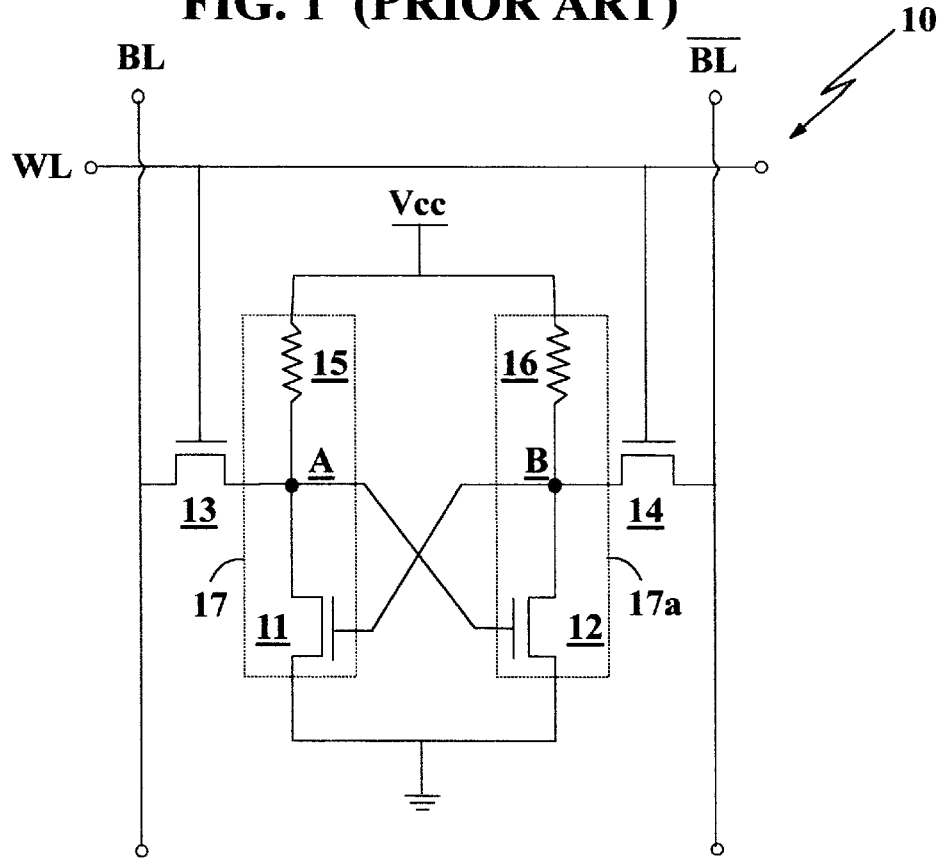
FIG. 1 is a schematic view of a prior art four transistor SRAM with resistive loads with each of the invertor FET transistors and its associated resistive loads surrounded by dashed lines.

A four transistor SRAM circuit or cell 10, as shown in the schematic of FIG. 1, comprises a pair of cross-coupled pull down transistors 11 and 12, each connected to one of a pair of pass-gate transistors 13 and 14 and each connected to one of a pair of load resistors 15, 16. The associated pull-down transistors and load resistors are encircled with dashed lines 17 and 17a as shown in FIG. 1. Base nodes A and B are also shown in FIG. 1. The purpose of the load resistors 15, 16 is to maintain the bias of each of the nodes A and B at its base once the cell has been programmed. The resistance of each of the load resistors, for example 15, is critical because, to maintain a "1" state at the base node A, the load resistance must be much lower than the effective resistance of the "off" pull-down transistor 12 side of the base node. This means that the resistor must be able to supply a current which is much greater than the pull-down transistor leakage and which is about 1 nA. However, the load resistance of resistor 16 must not be so low that the pull-down transistor 13 cannot overpower the load resistor and change the state of the base node A to "0". Another requirement of the load resistance is that the total leakage of the SRAM array be within allowable limits. Since the allowable load resistance is a function of the size of the array and the standby current, a load resistance of $10^9 \Omega$ will satisfy this requirement for array sizes up to 1 Mb. The prior art load resistor is a polysilicon resistor, which is either an undoped or an extremely lightly doped layer of polysilicon disposed between the polysilicon gate of an FET transistor and the contact to the gate.

Figure 1A:
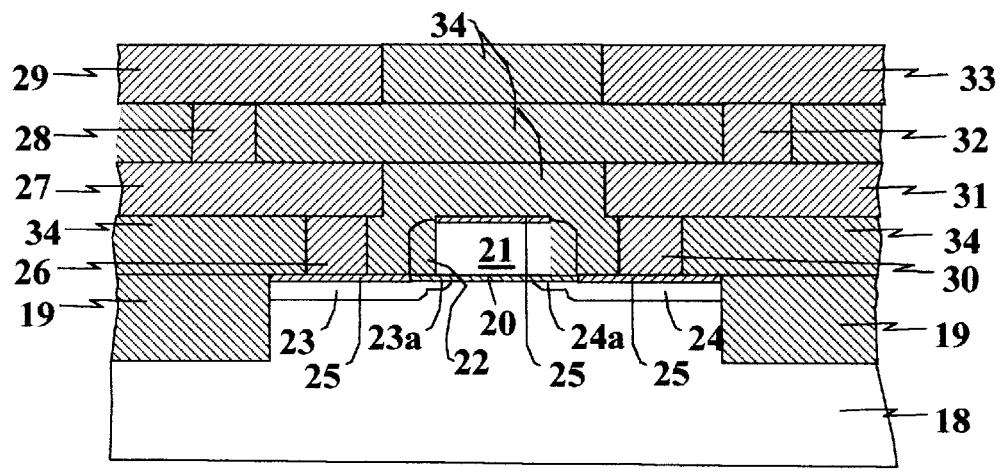
FIG. 1a is a cross-sectional view of a prior art FET with two levels of conductive lines interconnected by vias.

In FIG. 1a, a prior FET is shown with two levels of metallization. The FET comprises a silicon substrate 18 with field isolation areas 19. Between the isolation areas 19 is a gate oxide under a gate 20 having sidewalls 21 which were used in conjunction with the gate to create a source 23 and a drain 24, both with a lightly doped drains (LDD) 23a and 24a. A metal silicide layer 25 is disposed on the gate 20, source 23, and drain 24 for increased conductivity. Contact 26 is disposed on the metal silicide layer of the source and is connected to a first conductive layer 27 through a via 28 to a second level conductive layer 29. Contact 30 is disposed on the metal silicide layer 25 of the drain and is connected to a first level conductive layer 31 through a via 32 to a second level conductive layer 33. The contacts 26, 30, conductive layers 27, 29, 31, and 33 and vias 28, 32 are isolated from each other by insulation layers 34.

In accordance with the present invention, α-silicon is used in fabricating load resistors 15, 16. α-silicon is a material which has a nonlinear voltage-current dependance. Current through a given layer of α-silicon follows the general relationship of $$I = A/t e^{kV}$$

wherein A is the area of the α-silicon, t is the thickness of layer of α-silicon, and k is a constant. By sandwiching a layer of α-silicon between two layers of barrier metals at either an opening for a contact, such as contact 30 of the prior art FET of FIG. 1a, or in a via between two levels of conductive lines, such as via 32 of the prior art FET of FIG. 1a, this structure will function as a resistive load while not utilizing any additional silicon real estate.

Figure 2A:
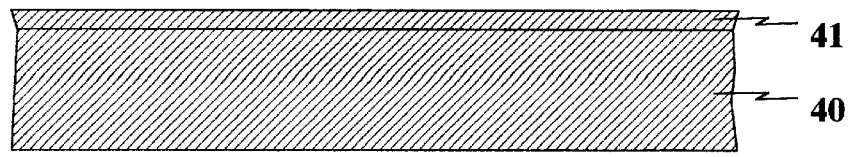
FIG. 2a is a cross-sectional view of the portion of a conductive line with a barrier metal layer as the starting point for fabricating the preferred embodiment of the present invention.
Figure 2B:
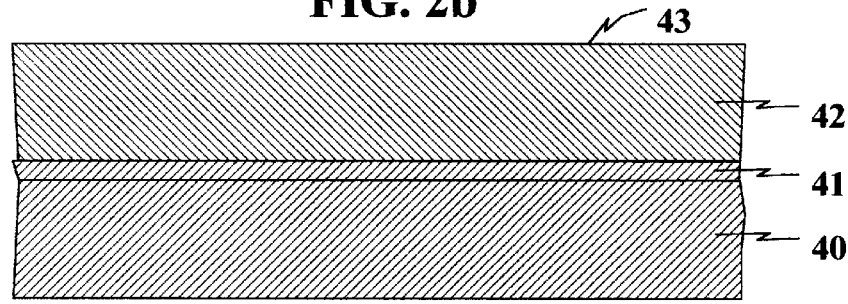
FIG. 2b is a cross-sectional view of the portion of the conductive line of FIG. 2a with a thick insulating layer on the barrier metal layer.
Figure 2C:
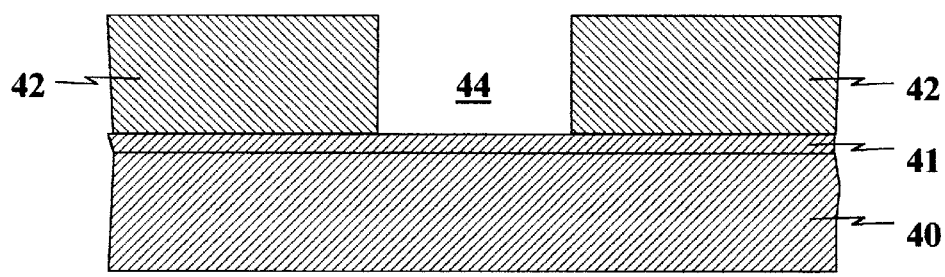
FIG. 2c is a cross-sectional view of the portion of the conductive line of FIG. 2b with a via opening formed in the insulating layer.
Figure 2D:
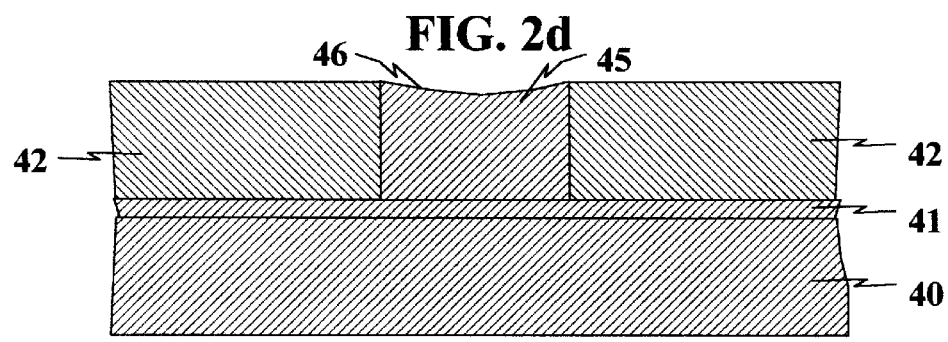
FIG. 2d is a cross-sectional view of the portion of the conductive line of FIG. 2c with the via opening in the insulating layer filled with a conductive metal.
Figure 2E:
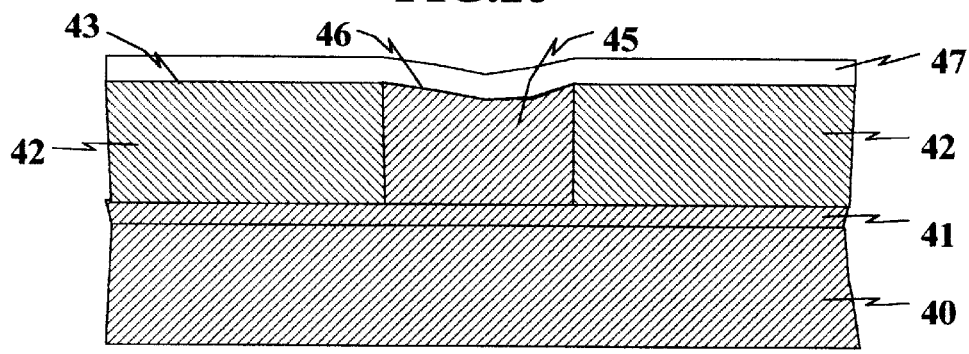
FIG. 2e is a cross-sectional view of the portion of the conductive line of FIG. 2d with an α-silicon layer on the top surface of the conductive metal in the via opening.

One preferred embodiment of the α-silicon resistive load in a via between conductive lines is fabricated by starting with a first conductive line 40 with a lower barrier layer 41 formed thereon as shown in FIG. 2a. An interlevel insulating layer 42 with an upper surface 43 is formed on the barrier layer 41 and a via opening 44 is formed in the layer 42 to the barrier layer 41 as shown in FIGS. 2b and 2c. The opening 44 is filled with a conductive material 45 and is planarized so that its top surface 46 is substantially level with the upper surface 43 of the insulating layer 42 as shown in FIG. 2d. In this embodiment, the conductive material 45 serves as an extension of the barrier layer 41. Now, a layer 47 of α-silicon is formed on top surface 46 of the conductive material 45 as shown in FIG. 2e and, after masking and etching, extends on both sides of the conductive material to contact the upper surface 43 of the insulating layer 42, as shown in FIG. 2f to insure that the α-silicon layer completely covers the conductive material 45 in the opening 44.

The thickness and the area (e.g.—diameter) of the α-silicon layer, depending on the bias voltage during operation, establishes the leakage current. For example, leakage current at 4V bias is approximately 2 nA when the α-silicon layer 47 is formed with a thickness of 1000 Å and a diameter of about 1 μm. If the bias is increased to 5V, the leakage current increases to approximately 10 nA. As shown by the above equation relationship, leakage current is directly proportional to the area of the α-silicon layer 47 and may be further changed by varying the thickness of the layer 47. For example, changing the thickness of α-silicon layer 47 by 200 Å results in 50 to 100 percent variation in leakage current.

Figure 2F:
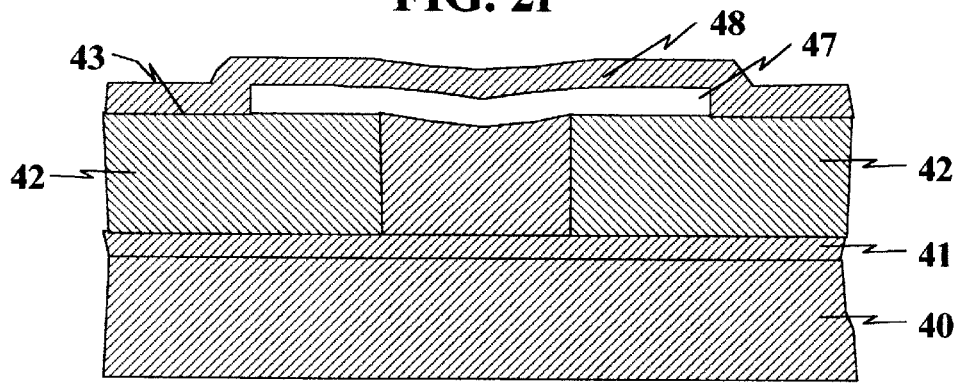
FIG. 2f is a cross-sectional view of the portion of the conductive line of FIG. 2e with a barrier metal layer on the α-silicon layer.

Next, an upper barrier layer 48 is formed on the α-silicon layer 47 and the upper surface 43 of the insulating layer 42 as shown in FIG. 2f. A second conductive line 49 is now formed on the upper barrier layer 48 to complete the α-silicon resistor in the via opening 44.

Figure 3A:
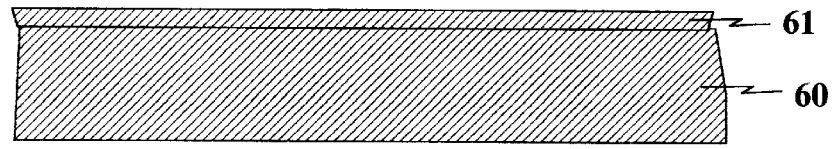
FIG. 3a is a cross-sectional view of the portion of a conductive line with a first barrier metal layer as the starting point of an alternative embodiment of the present invention.
Figure 3B:
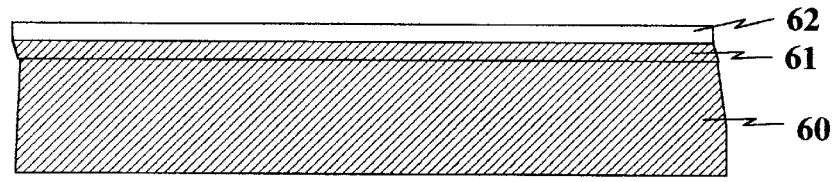
FIG. 3b is a cross-sectional view of the portion of the conductive line of FIG. 3a with an α-silicon layer on the first barrier layer.
Figure 3C:
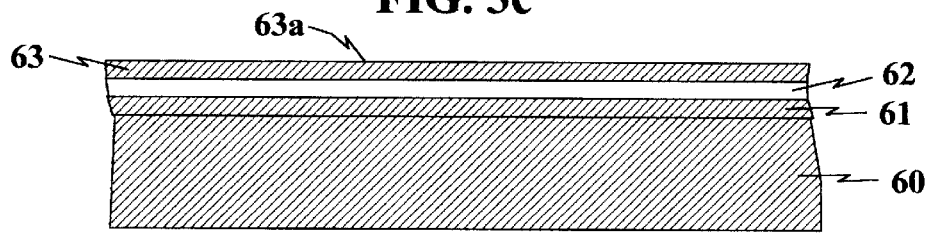
FIG. 3c is a cross-sectional view of the portion of the conductive line of FIG. 3b with a second barrier metal layer on the α-silicon layer.
Figure 3D:
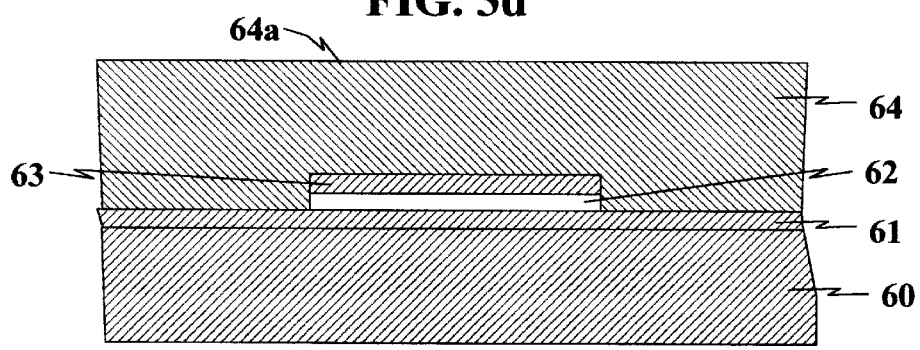
FIG. 3d is a cross-sectional view of the portion of the conductive line of FIG. 3c with a thick insulating layer surrounding the α-silicon layer and second barrier metal layer and on the first barrier metal layer.
Figure 3E:
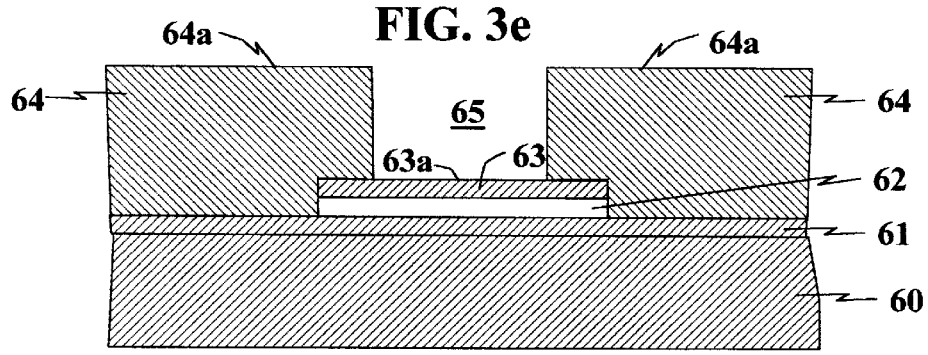
FIG. 3e is cross-sectional view of the portion of the conductive line of FIG. 3d with a via opening in the insulating layer to the second barrier metal layer.
Figure 3F:
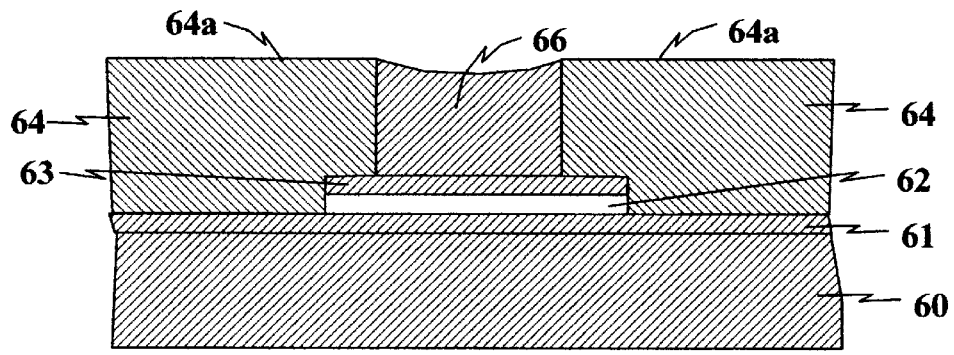
FIG. 3f is cross-sectional view of the portion of the conductive line of FIG. 3e with the via opening filled with a conductive material.
Figure 3G:
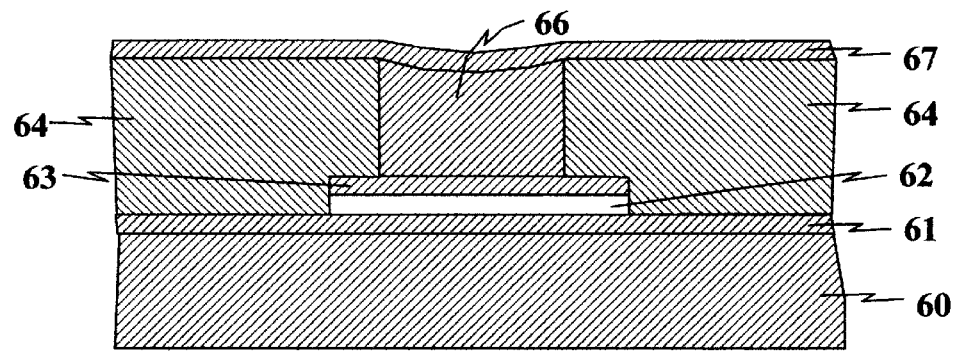
FIG. 3g is cross-sectional view of the portion of the conductive line of FIG. 3f with a third barrier layer on the top of conductive material and the surface of the insulating layer.
Figure 3H:
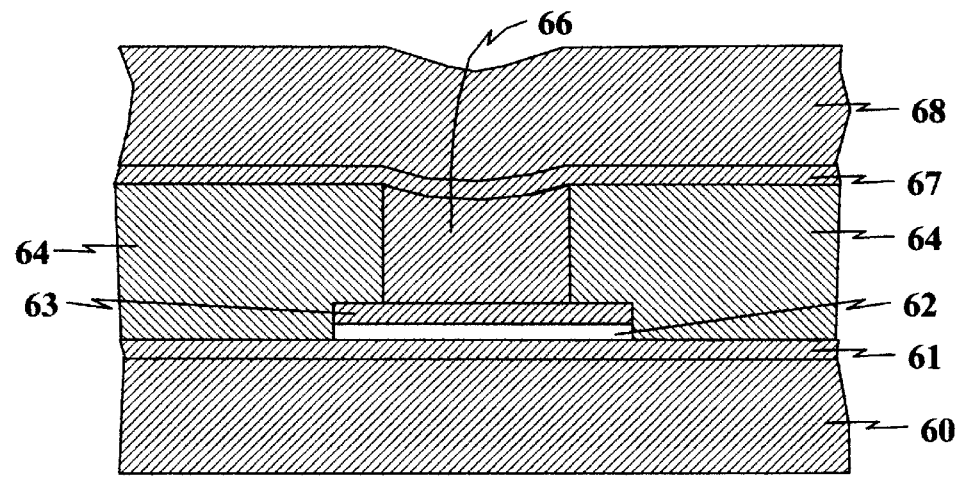
FIG. 3h is a cross-sectional view of the portion of the conductive line of FIG. 3g with a conductive line of the next level on the barrier metal layer.

An alternate preferred embodiment reverses the sequence of the layers. Again, the resistive load is formed by sandwiching a layer of α-silicon between two layers of barrier metals at a via between two levels of conductive lines, such as via 32 of the prior art FET of FIG. 1a. This alternative structure is not suitable at an opening for a contact, such as contact 30. The starting point is with a first conductive line 60 with a first barrier layer 61 formed thereon as shown in FIG. 3a. However, a layer of α-silicon 62 is next formed on the first barrier layer 31 as shown in FIG. 3b and, as shown in FIG. 3c, a second barrier layer 63 with an upper surface 63a is formed on the α-silicon layer 62. Both layers 62 and 63 are masked and etched and an interlevel insulating layer 64 with a top surface 64a is formed over and encapsulates the layers 62 and 63 as shown in FIG. 3d. Now, as shown in FIG. 3e, a via opening 65 is formed in the insulating layer 64 and the opening extends to the upper surface 63a of the second barrier layer 63. Conductive material 66 fills the via opening 65 and is substantially planar with the top surface 64a of layer 64 as shown in FIG. 3f. To complete this embodiment of the α-silicon resistor, a third barrier layer 67 is formed on the conductive material 66 and the top surface 64a of the layer 63 and a second conductive layer 68 is formed on the barrier layer 67 as shown in FIGS. 3g and 3h.

To supplement the above general description of the preferred embodiments of the present invention, a detailed description of fabricating the α-silicon resistor and its resultant structure will now be given. The α-silicon resistor is to be fabricated in the opening of via 32 in the prior art FET of FIG. 1a. As shown in FIG. 2a, a first conductive line 41, which is comparable to conductive line 31 of FIG. 1a, is preferably a metal of aluminum (Al) or an aluminum alloy, such as Al with a small percentage of copper and/or silicon, of a thickness of about 5000 Å. On the conductive line 40 is a barrier metal layer 41, such as titanium tungsten (TiW), titanium nitride (TiN$_2$) and tungsten (W), with a thickness of in the range of about 300 Å to about 1200 Å. Preferably, the barrier layer 41 is TiW at a thickness of about 500 Å and is deposited on the conductive line 40 by sputter deposition using a single target in an Ar—N$_2$ ambient. The resistivity of TiW is in the range of 60–100 $\mu\Omega$-cm. With the barrier layer 41 on the conductive line 40, an interlevel insulating layer 42 is deposited on the conductive line 40 in a manner conventional in fabricating metallization layers in a FET integrated circuit. Herein, the insulating layer 42, as shown in FIG. 2b is silicon oxide and is CVD deposited from a TEOS source to a thickness of about 10000 Å. The silicon oxide layer 42 is planarized to smooth its surface 42a, preferably by CMP using a commercially available slurry. Next, a via opening 44 is formed in the insulating layer 42, preferably by anisotropic etching using a parallel plate reactor and a plasma gas of carbon tetrafluoride and hydrogen (CF$_4$/H$_2$). Other vias in the insulating layer 42 can be formed at the same time, but they would have to be masked during some of the subsequent steps in fabricating the α-silicon resistor. A metal 45 is now deposited in the via opening 44 and on the metal barrier 41. Herein, the metal 45 is tungsten and it is deposited by CVD using tungsten hexafluoride (WF$_6$) as the source. If desired, tungsten may also be deposited in other via openings at the same time as it is deposited in fabricating the α-silicon resistor. After deposition, the tungsten is etched back using a parallel plate reactor and a plasma gas of CCl$_2$F$_2$/O$_2$ so that the top surface 46 is substantially level with the upper surface 43 of the insulating layer as shown in FIG. 2c. Since tungsten also functions as a barrier material, the tungsten plug 45 in the via opening 44 serves, in combination with the barrier layer 41, as the lower barrier layer in the α-silicon resistor. Alternatively, the barrier layer 41 can be eliminated and the tungsten plug 45 serve solely as the lower barrier layer.

If other vias have been opened and filled with tungsten, they must be masked before the next step, which is the deposition of an α-silicon layer 47. The layer 47 preferably deposited by CVD using silane as the source and at a temperature below 580° C. and, herein, at about 400° C. Since the tunability of the load resistance can be accomplished by adjusting the thickness and the size (e.g.— diameter) of the α-silicon layer, these dimensions are governed by the desired load resistance. For example, an α-silicon resistor, with α-silicon layer having a thickness of 1000 Å and a filled via diameter of about 1 $\mu$m, will have leakage current of 10 nA at a 4 volt bias. The α-silicon layer 47 thus is masked (not shown) and etched using a parallel plate reactor and a plasma gas of CF$_4$/O$_2$ to extend only beyond the tungsten plug 45 to insure coverage of the plug 45 and to tailor the α-silicon layer 47 to the desired resistance.

Figure 2G:
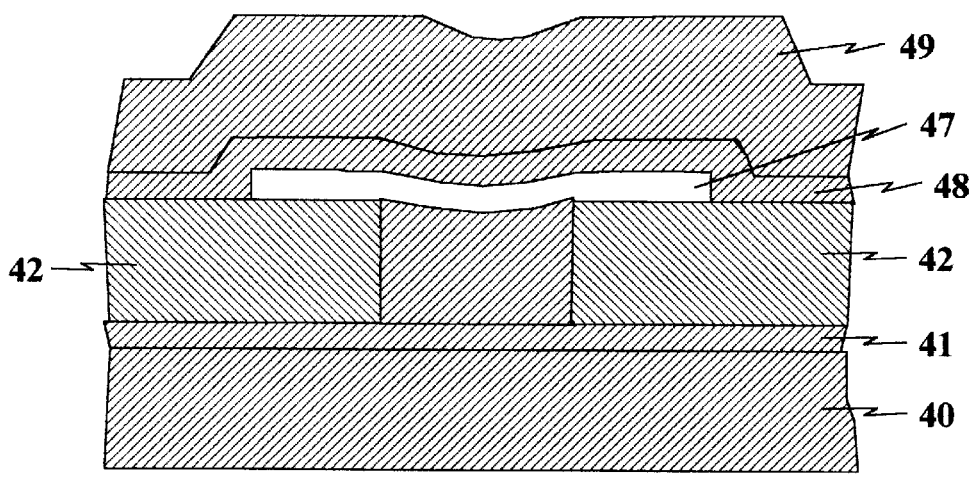
FIG. 2g is a cross-sectional view of the portion of the conductive line of FIG. 2f with a conductive line of the next level on the barrier metal layer.

Now, an upper or second barrier metal layer 48 of the same or similar material, such as TiW, TiN$_2$, and W, as the lower or first barrier layer is sputtered deposited in the same manner on the α-silicon layer 47 and encases the layer 47. A second conductive line 49, as shown in FIG. 2g, of the same material as the first conductive line is deposited in the same manner as the first after first removing the appropriate masking of any other filled vias which need to be connected to this conductive line.

Another preferred embodiment of the present invention is shown in FIGS. 3a–3h. In this embodiment, the order of the α-silicon layer and the metal plug is reversed. As shown in FIG. 3a, the starting point is a first conductive line 60 which also is aluminum or an aluminum alloy as in the first preferred embodiment. A first metal barrier layer 61 is sputter deposited on the conductive line 60 and preferably is TiW of about 500 Å in thickness. Now, instead of depositing the interlevel insulation layer of the first preferred embodiment, an α-silicon layer 62 is deposited. Again, the layer 62 is CVD deposited from a source of silane at a temperature below 580° C. and preferably about 400° C., with the thickness and subsequent size controlling the desired leakage current. Next, a second barrier layer 63 is sputter deposited in the same manner as the first barrier layer 61. Both α-silicon layer 62 and barrier layer 63 are masked (not shown) and etched using a paralled plate reactor and first a plasma gas of CF$_4$/O$_2$ followed by a plasma gas of CF$_4$/O$_2$ to leave an exposed upper surface 63a as shown in FIG. 3c. Now, an interlevel insulating layer 64 is CVD deposited from a source of TEOS to conformally cover the sandwich of the α-silicon layer 62 and the second barrier layer 63 with silicon oxide. The surface 64a of the insulating layer 64 is planarized by CMP as in the first preferred embodiment.

A via opening 65, as shown in FIG. 3e, is etched in the insulating layer 64 in alignment with the sandwich of the α-silicon layer 62 and the second barrier layer 63 with silicon oxide. Again, the etching is carried out using a parallel plate reactor and a plasma gas of CF$_4$/O$_2$ to anisotropically etch the silicon oxide to the second barrier layer. The etchant gas is more selective for the silicon oxide than the TiW so that the TiW serves as an etch stop. The opening 65 is filled with a conductive metal, as shown in FIG. 3f, preferably tungsten and is etched back in the same manner as the first preferred embodiment. One advantage of this alternative preferred embodiment is that other via openings can be etched and filled at the same time as the opening 65 without resorting to masking.

The final two steps are to deposit another metal barrier layer 67, which in this embodiment is the third barrier layer, and a conductive line 68. These steps are the same as the first preferred embodiment and are carried out in the same manner as that embodiment.

The advantages of the α-silicon resistor structure of both of the preferred embodiments of the present invention are at least fourfold: namely—(1) reduced layout area; (2) tunability of the load resistance; (3) simplicity in manufacturing; and (4) stability. Advantage (1) is achieved by implementing each of the load resistors of a four transistor SRAM cell in a via between conductive lines so that the size of the SRAM cell is substantially reduced. Advantage (2) is made possible by tailoring the size and thickness of the α-silicon layer to any desired leakage current and thereby any desired load resistance. Advantage (3) results from implementing the load resistor in a via opening as part of a pre-existing backend process with only one additional critical mask. Finally, advantage (4) is the result of fabricating the α-silicon load resistor near the end of the backend of the manufacturing process so that, unlike the polysilicon resistor which is fabricated in the frontend process, the α-silicon load resistor is not affected by the temperature levels of some of the backend processes.

Although this invention has been described relative to specific materials, and apparatuses for depositing and etching these materials, it is not limited to the specific materials or apparatuses but only to their specific characteristics. Other materials and apparatus can be substituted for those described herein which will be well understood by those skilled in the microelectronics and semiconductor arts after appreciating the present invention.

Having thus described the invention, what is claimed is:

1. A combined field effect transistor (FET) and an amorphous (α) silicon load resistor disposed in and on a silicon substrate, respectively comprising:

said field effect transistor with a level of metallization of a first conductive line disposed thereon;

an interlevel insulating layer on the conductive line with a via opening having a bottom adjacent the first conductive line;

said amorphous silicon load resistor comprising a conductive material in the via opening and an amorphous silicon layer adjacent the conductive material and a plurality of barrier metal layers, at least one of the barrier metal layers being in contact with said amorphous silicon layer and at least one of the barrier metal layers being in contact within the conductive material; and a level of metallization of a second conductive line, said amorphous-silicon load resistor being disposed between the first and second conductive lines.

2. The combination of claim 1 wherein the amorphous-silicon layer is sandwiched between two barrier metal layers.

3. The combination of claim 2 wherein the barrier metal layer on the bottom of the amorphous-silicon layer is formed to extend beyond the amorphous-silicon layer and the barrier metal layer on the top of the amorphous-silicon layer is substantially equivalent in area to the amorphous-silicon layer.

4. The combination of claim 1 wherein the amorphous-silicon layer is disposed in contact with the conductive material.

5. The combination of claim 1 wherein the plurality of barrier metal layers comprise a first barrier layer and second barrier layer, said first barrier layer being disposed in contact with the first conductive line and the second barrier layer being disposed in contact with the second conductive line.

6. The combination of claim 5 wherein the plurality of barrier metal layers comprise a third barrier layer, said third barrier layer being disposed between the conductive material and the amorphous-silicon layer.

7. The combination of claim 6 wherein the third barrier layer, the amorphous-silicon layer and the conductive material are all disposed within the interlevel insulating layer.

8. The combination of claim 5 wherein the first and second barrier layers extend beyond the amorphous-silicon layer.

9. The combination of claim 1 wherein the amorphous-silicon layer extends beyond the conductive material in the via opening.

10. The combination of claim 1 wherein the barrier layer in contact with the amorphous-silicon layer is disposed on top of and overlaps the α-silicon layer.

11. The combination of claim 1 wherein the conductive material is sandwiched between said at least one barrier metal layer and the amorphous-silicon layer and the conductive material and the barrier layer coact as a barrier.

* * * * *